United States Patent
Tsai et al.

(10) Patent No.: US 10,348,126 B2
(45) Date of Patent: Jul. 9, 2019

(54) BATTERY SWITCHING METHOD

(71) Applicant: Chiun Mai Communication Systems, Inc., New Taipei (TW)

(72) Inventors: Wen-Hann Tsai, New Taipei (TW); Pi-Feng Shih, New Taipei (TW); Chin-Kun Lai, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 285 days.

(21) Appl. No.: 15/333,121

(22) Filed: Oct. 24, 2016

(65) Prior Publication Data

US 2017/0126055 A1    May 4, 2017

Related U.S. Application Data

(63) Continuation-in-part of application No. 14/955,003, filed on Nov. 30, 2015, now Pat. No. 9,985,472.

(30) Foreign Application Priority Data

Oct. 28, 2015   (CN) .......................... 2015 1 0708296

(51) Int. Cl.
*H02J 9/06* (2006.01)
*H02J 7/00* (2006.01)
*G01R 33/07* (2006.01)

(52) U.S. Cl.
CPC ............ *H02J 9/061* (2013.01); *G01R 33/072* (2013.01); *H02J 7/0013* (2013.01); *H02J 7/0021* (2013.01)

(58) Field of Classification Search
CPC ................ H02J 9/06; H02J 7/00; G01R 33/07

USPC .......................................................... 307/66
See application file for complete search history.

(56) References Cited

U.S. PATENT DOCUMENTS

| | | | | |
|---|---|---|---|---|
| 2003/0169022 A1* | 9/2003 | Turner | ...................... | G06F 1/30 320/166 |
| 2009/0251007 A1 | 10/2009 | Adams et al. | | |
| 2010/0072975 A1 | 3/2010 | Hori | | |
| 2013/0106355 A1* | 5/2013 | Kim | ...................... | H02J 7/0013 320/118 |
| 2014/0015477 A1* | 1/2014 | Tsai | ...................... | H02J 7/0042 320/107 |
| 2015/0241911 A1 | 8/2015 | Lim | | |

FOREIGN PATENT DOCUMENTS

| | | |
|---|---|---|
| CN | 101685897 A | 3/2010 |
| CN | 102007667 A | 4/2011 |
| TW | 201118541 A1 | 6/2011 |
| TW | M477603 U | 5/2014 |

* cited by examiner

*Primary Examiner* — Daniel Kessie
*Assistant Examiner* — Swarna N Chowdhuri
(74) *Attorney, Agent, or Firm* — ScienBiziP, P.C.

(57) ABSTRACT

A battery switching method applicable to an electronic device is provided. The electronic device comprises a first battery and a second battery. The method comprises: (a) switching the electronic device to a sleep mode from a normal mode; (b) switching a power supply of the electronic device to the second battery according to a removing signal triggered by removing the first battery; (c) switching the power supply of the electronic device to the first battery according to an inserting signal triggered by inserting the first battery; (d) updating parameters of the first battery; and (e) switching the electronic device to the normal mode from the sleep mode.

11 Claims, 5 Drawing Sheets

BATTERY SWITCHING METHOD

CROSS-REFERENCE TO RELATED APPLICATIONS

This application is a continuation in part of U.S. application Ser. No. 14/955003, entitled "SENSING DEVICE AND WEARABLE DEVICE WITH SAME", filed on Nov. 30, 2015, which is based upon and claims the benefit of priority from Chinese Patent Application No. 201510708296.7, filed on Oct. 28, 2015 in People's Republic of China. The entirety of each of the above-mentioned patent applications is hereby incorporated by reference herein.

FIELD

The subject matter herein generally relates to a battery switching method.

BACKGROUND

Electronic devices, for example, wearable devices are generally limited by small volume. Therefore, a capacity of a battery positioned at an interior of the electronic device is small and the electronic device cannot be used for a long time. Once the power of the battery is exhausted, the electronic device can only be normally operated after the battery is fully recharged.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to", it specifically indicates open-ended inclusion or membership in the so-described combination, group, series and the like.

The present disclosure is described in relation to a battery switching method.

Figure 1:
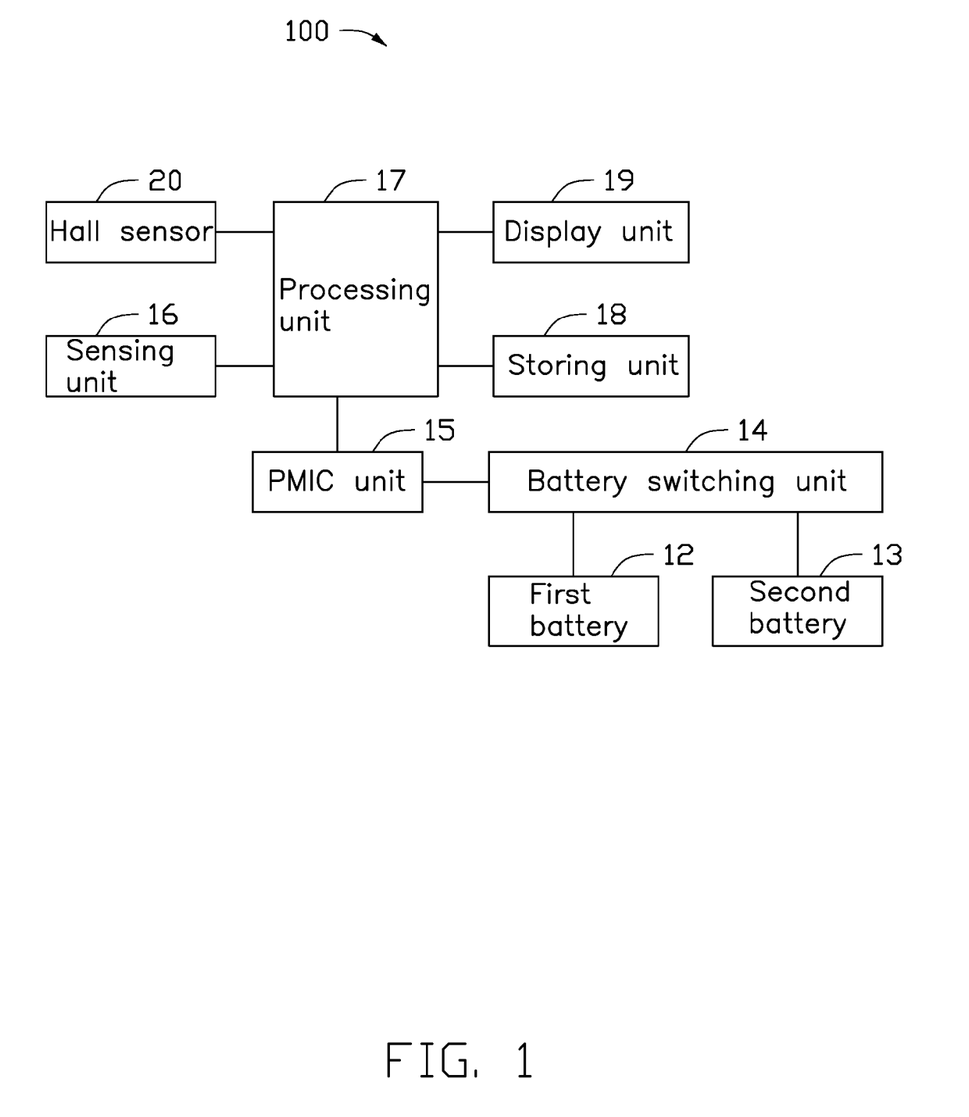
FIG. 1 is a block diagram of an exemplary embodiment of an electronic device applying to a wearable device.

FIG. 1 illustrates an exemplary embodiment of an electronic device 100. The electronic device 100 includes a main body 11 (shown in FIG. 2), a first battery 12, a second battery 13, a battery switching unit 14, a power management integrate circuit (PMIC) unit 15, a sensing unit 16, a processing unit 17, and a storing unit 18.

Figure 2:
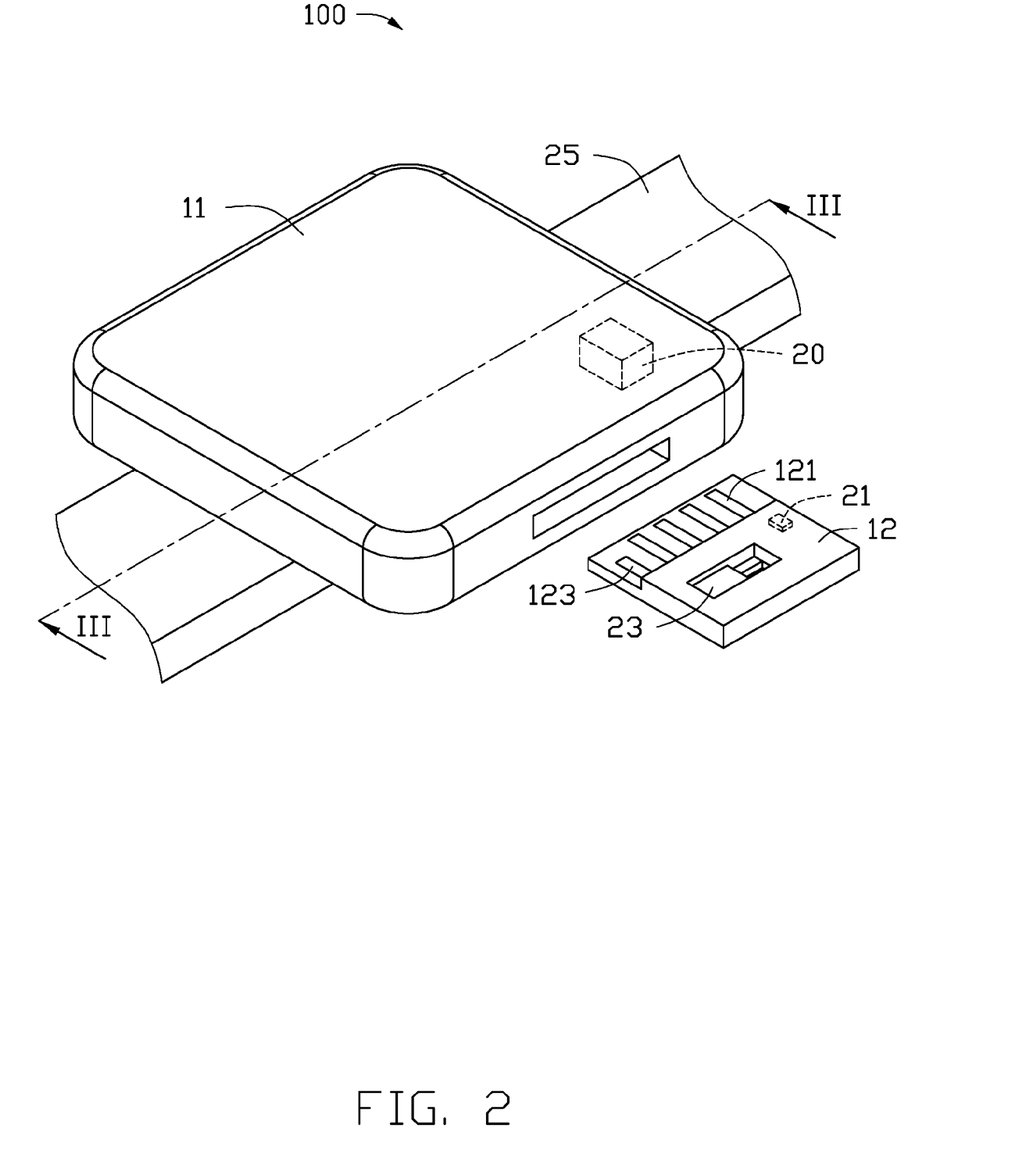
FIG. 2 is an isometric view of the wearable device of FIG. 1.

As illustrated in FIG. 2, the main body 11 can be rectangular, or other shapes such as a circular shape. The first battery 12 is positioned at an exterior of the main body 11 and can be plugged in the main body 11. The first battery 12 is further electrically connected to the PMIC unit 15 through the battery switching unit 14 for providing power to the PMIC unit 15 as shown in FIG. 1.

In FIG. 2, the first battery 12 includes at least a power terminal 121 and an ID terminal 123. In one exemplary embodiment, the power terminal 121 and the ID terminal 123 are both metallic terminals. A length of the ID terminal 123 is less than a length of the power terminal 121. When the first battery 12 is inserted in the main body 11, the power terminal 121 and the ID terminal 123 are both electrically connected to a connector (not shown) that is positioned at an interior of the main body 11. Then, the first battery 12 is electrically connected to the PMIC unit 15 for providing power to the PMIC unit 15. When the first battery 12 is removed from the main body 11, due to the length of the ID terminal 123 being less than that of the power terminal 121, the ID terminal 123 is disconnected first from the connector of the main body 11 and the power terminal 121 remains in connection with the connector. Then the first battery 12 temporarily provides power to the PMIC unit 15 through the power terminal 121 until the first battery 12 is fully removed from the main body 11. Full removal means that the power terminal 121 and the ID terminal 123 are both disconnected from the connector.

In one exemplary embodiment, a capacity of the second battery 13 is less than that of the first battery 12. The second battery 13 is positioned at an interior of the main body 11 and is electrically connected to the PMIC unit 15 through the battery switching unit 14. The second battery 13 is configured to provide power to the PMIC unit 15 when the ID terminal 123 of the first battery 12 is disconnected from the connector.

The battery switching unit 14 is electrically connected to the first battery 12 and the second battery 13. The battery switching unit 14 is configured to detect if the first battery 12 is inserted to the main body 11 or is removed from the main body 11. In one exemplary embodiment, the battery switching unit 14 can determine if the first battery 12 is inserted to the main body 11 or is removed from the main body 11 by detecting whether or not the ID terminal 123 is electrically connected to the connector positioned in the main body 11. When the battery switching unit 14 detects that the power terminal 121 and the ID terminal 123 are both electrically connected to the connector in the main body 11, the battery switching unit 14 determines that the first battery 12 is plugged to the main body 11 and the battery switching unit 14 switches the PMIC unit 15 to the first battery 12, thus the electronic device 100 is powered by the first battery 12.

When the battery switching unit 14 detects that the ID terminal 123 is disconnected from the connector in the main body 11, the battery switching unit 14 determines that the first battery 12 is removed from the main body 11 and the battery switching unit 14 switches the PMIC unit 15 to the second battery 13, thus the electronic device 100 is powered by the second battery 13.

When the first battery 12 is removed from the main body 11 and only the ID terminal 123 is disconnected from the connector in the main body 11, due to the power terminal 121 is still electrically connected to the connector, the first battery 12 still provides power to the electronic device 100. Then the battery switching unit 14 can switch the PMIC unit 15 from the first battery 12 to the second battery 13 during the time lag between the disconnection of the ID terminal 123 and the disconnection of the power terminal 121, thus ensuring that the electronic device 100 can be continually powered when the first battery 12 is removed from the main body 11.

The PMIC unit 15 is configured to provide power to the electronic device 100, that is, the PMIC unit 15 converts the power input to the PMIC unit 15 (for example, the first battery 12 and the second battery 13) to a plurality of power supplies with different voltages and/or currents that each module in the electronic device 100 needed, thus providing power to each module of the electronic device 100.

The sensing unit 16 includes at least one sensor, for example, a health detecting sensor and/or an environment sensor. The health detecting sensor can at least include a pulse sensor for detecting a human's pulse and a temperature sensor for detecting a human's temperature. The environment sensor can at least include a temperature sensor for detecting environmental temperature, a humidity sensor for detecting environmental humidity, and a pressure sensor for detecting air pressure. The sensing unit 16 is positioned in the main body 11 and is configured to detect and provide sensing information, for example, health information and/or environmental information.

The processing unit 17 can be a central processing unit (CPU) and is electrically connected to the sensing unit 16 and the storing unit 18. The processing unit 17 is configured to receive and process sensing information from the sensing unit 16, for example, health information and/or environmental information, and can selectably store the processed health information and/or environmental information to the storing unit 18.

As illustrated in FIG. 1, the electronic device 100 can further include a display unit 19. The display unit 19 can be a liquid crystal module (LCM) and is positioned on the main body 11. The display unit 19 is electrically connected to the processing unit 17 and is configured to display time. The display unit 19 can also display the sensed information, for example, health information and/or environmental information.

FIG. 2 illustrates that the electronic device 100 further includes a hall sensor 20, a magnetic unit 21, and an operating unit 23. The hall sensor 20 is positioned on the main body 11. The magnetic unit 21 can be a magnet and is positioned on the first battery 12. The magnetic unit 21 is connected to the operating unit 23. The operating unit 23 can be operated to switch the electronic device 100 to a normal mode or a sleep mode. For example, when the first battery 12 needs to be recharged or be replaced by another first battery 12, the operating unit 23 can be operated to switch the electronic device 100 to the sleep mode. When the first battery 12 is fully recharged or is replaced by a new first battery 12, the operating unit 23 can be operated again, then the electronic device 100 is switched to the normal mode.

When the operating unit 23 is operable, the magnetic unit 21 moves closer to or away from the hall sensor 20. The hall sensor 20 is configured to sense the magnetic unit 21 and sends the sensing result to the processing unit 17. The processing unit 17 switches the electronic device 100 to the normal mode or the sleep mode according to the sensed result from the hall sensor 20. For example, when the operating unit 23 is operated to move the magnetic unit 21 away from the hall sensor 20, the hall sensor 20 cannot sense the magnetic unit 21 or senses that the magnetic unit 21 is away from the hall sensor 20, the processing unit 17 switches the electronic device 100 to the sleep mode for saving power of the electronic device 100 and allows the second battery 13 with a lower capacity to provide power to the electronic device 100. When the operating unit 23 is operated to move the magnetic unit 21 closer to the hall sensor 20, the hall sensor 20 senses the magnetic unit 21 or senses that the magnetic unit 21 is moved closer to the hall sensor 20, the processing unit 17 switches the electronic device 100 to the normal mode.

In other exemplary embodiments, when the magnetic unit 21 moves away from the hall sensor 20, the electronic device 100 is switched to the normal mode. When the magnetic unit 21 moves closer to the hall sensor 20, the electronic device 100 is switched to the sleep mode.

In other exemplary embodiments, when the electronic device 100 is switched to the sleep mode, due to the electronic device 100 is continually powered by the first battery 12 or the second battery 13, the sensing unit 16 can work normally and the processing unit 17 can collect the sensing information continually. In other words, even if the electronic device 100 is in the sleep mode and the electronic device 100 is powered by the second battery 13 with a lower capacity, the processing unit 17 can still continually collect the sensing information from the sensing unit 16.

Figure 3:
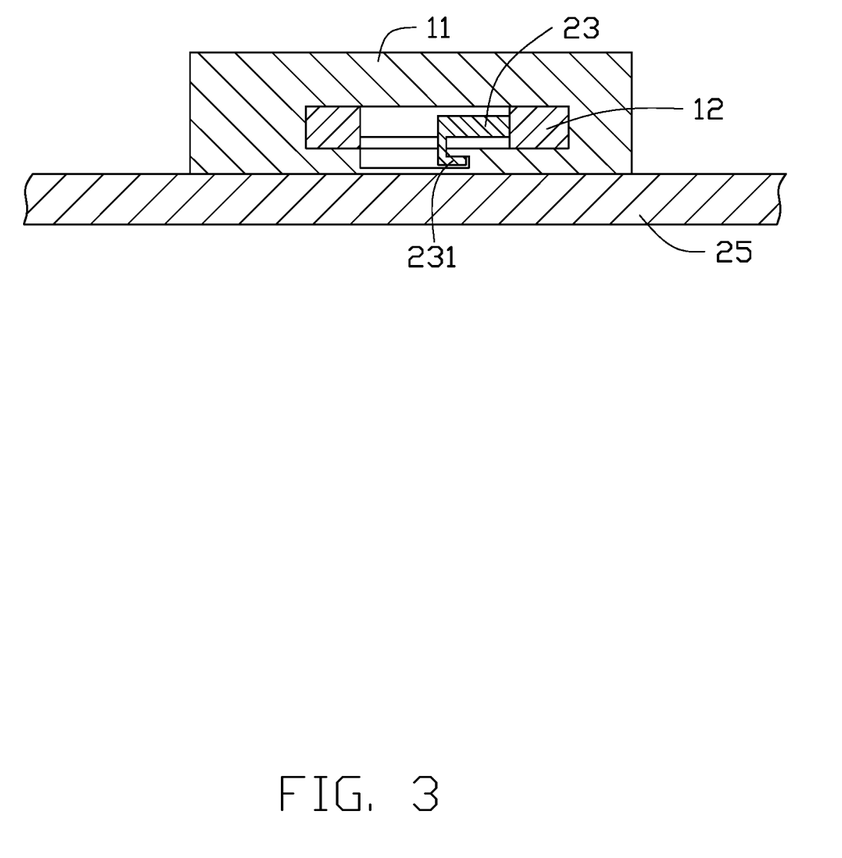
FIG. 3 is a cross-sectional view taken along line of FIG. 2.

As illustrated in FIG. 3, in at least one exemplary embodiment, the operating unit 23 is located on the first battery 12. A bottom portion of the operating unit 23 has a latching structure 231, such as a hook or the like. The latching structure 231 is configured to attach the first battery 12 to the main body 11 when the electronic device 100 is in the normal mode and to detach the first battery 12 from the main body 11 when the electronic device 100 is in the sleep mode.

For example, when the operating unit 23 is operated to move the magnetic unit 21 closer to the hall sensor 20, the processing unit 17 switches the sensing unit 21 to the normal mode, then the latching structure 231 attaches the first battery 12 to the main body 11, thus the first battery 12 can be stably latched in the main body 11. When the operating unit 23 is operated to move the magnetic unit 21 away from the hall sensor 20, the processing unit 17 switches the electronic device 100 to the sleep mode. Then the latching structure 231 detaches the first battery 12 from the main body 11 and thus the first battery 12 can be easily removed from the main body 11.

In other exemplary embodiments, when the operating unit 23 is operated to move the magnetic unit 21 away from the hall sensor 20, the processing unit 17 switches the electronic device 100 to the normal mode, then the latching structure attaches the first battery 12 to the main body 11, thus the first battery 12 can be stably latched in the main body 11. When the operating unit 23 is operated to move the magnetic unit 21 closer to the hall sensor 20, the processing unit 17 switches the electronic device 100 to the sleep mode. Then the latching structure 231 detaches the first battery 12 from the main body 11 and thus the first battery 12 can be easily removed from the main body 11.

In other exemplary embodiments, a capacity of the first battery 12 can be less than or equal to a capacity of the second battery 13. Then, when the electronic device 100 is switched to the second battery 13 from the first battery 12, the electronic device 100 may not need to enter the sleep mode, that is, the hall sensor 20, the magnetic unit 21, and the operating unit 23 can all be omitted as the electronic device 100 is still in operation under the normal mode.

In other exemplary embodiments, the electronic device 100 can further include a wearable portion 25. The wearable portion 25 can be attached at one end or two ends of the main body 11, so that the electronic device 100 and the wearable portion 25 can cooperatively form a wearable device (not labeled), for example, a wearable watch.

Figure 4:
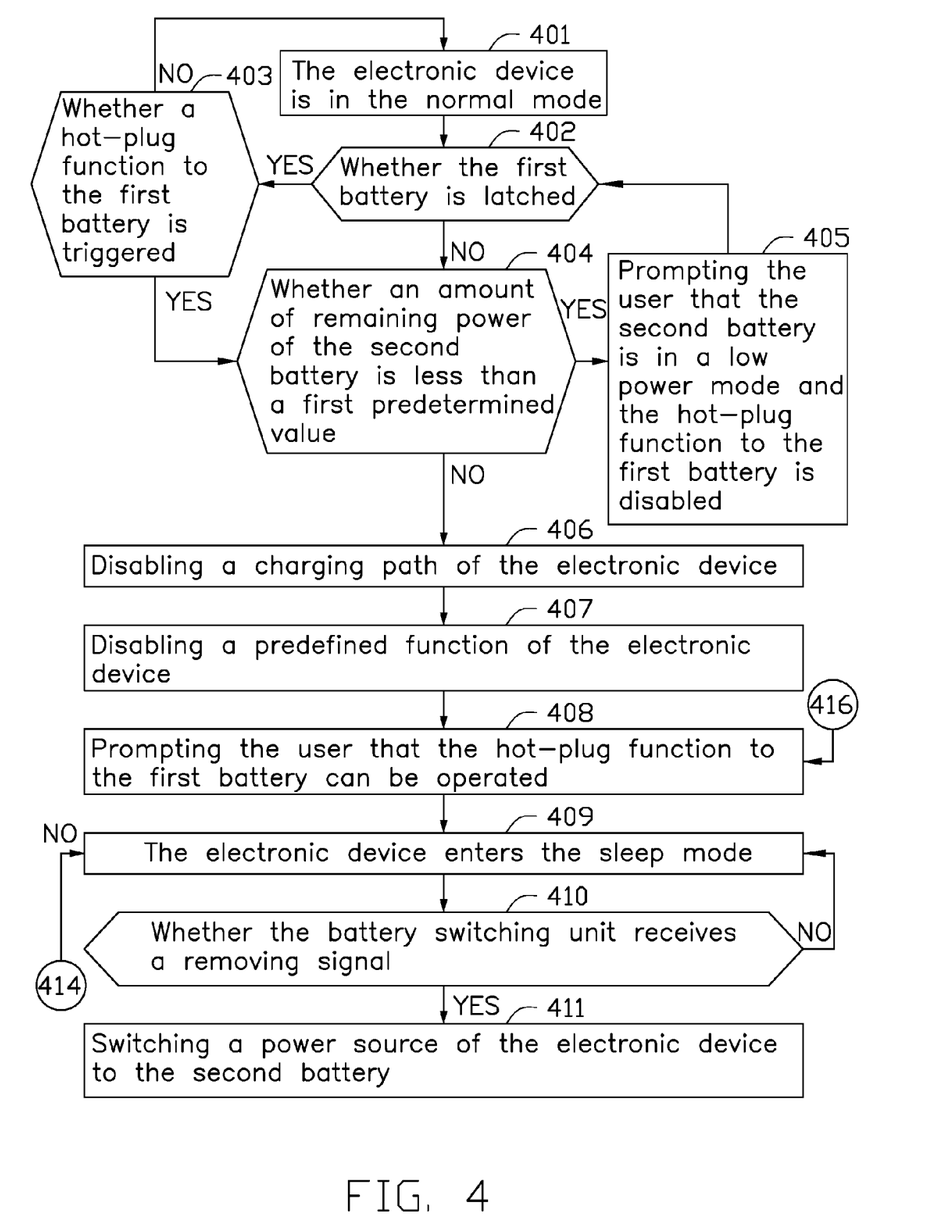
FIGS. 4-5 are flowcharts of a battery switching method applying to the electronic device of FIG. 1.
Figure 5:
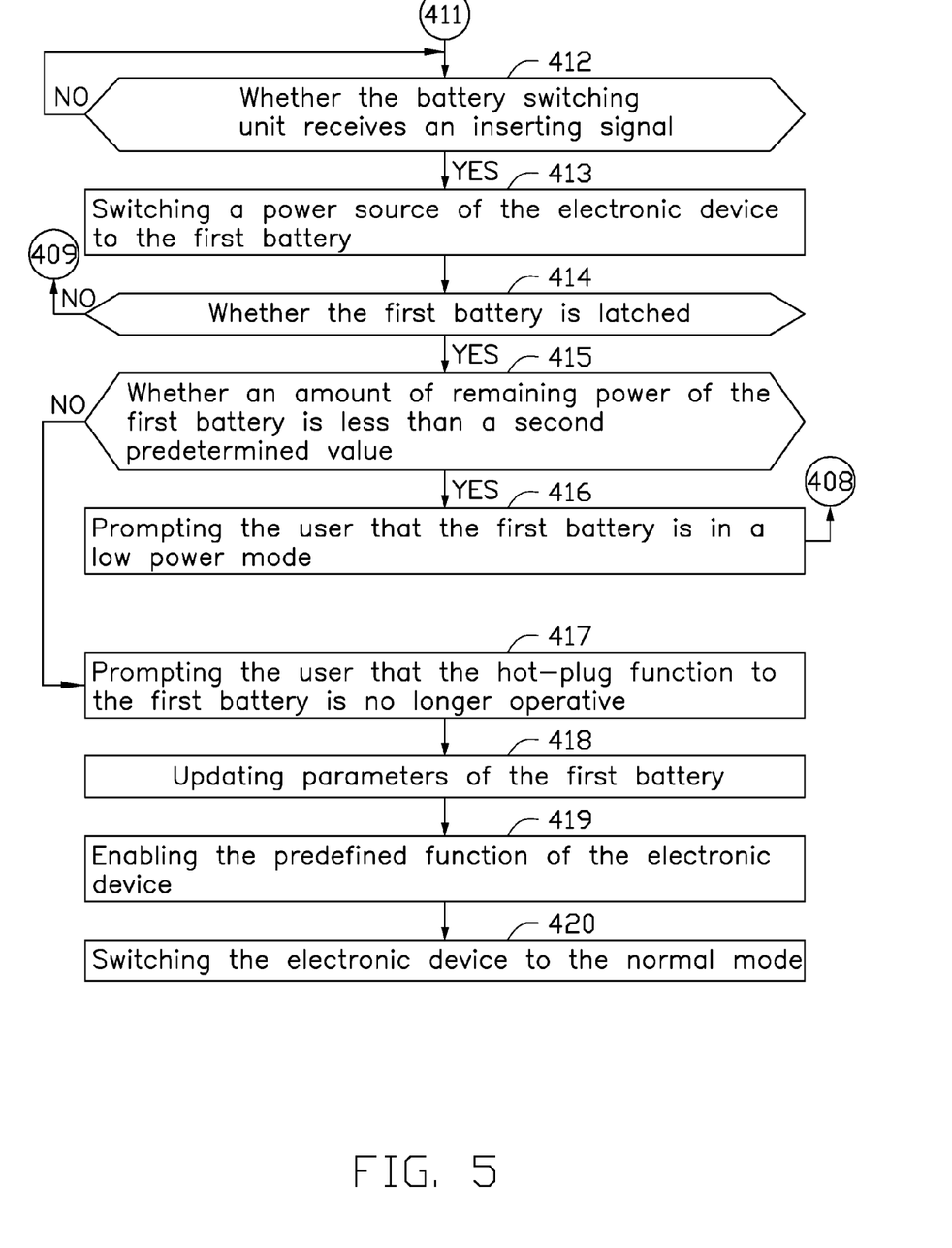

FIGS. 4-5 illustrate a flowchart of a battery switching method. The method is provided by way of example, as there are a variety of ways to carry out the method. Each block shown in FIGS. 4-5 represents one or more processes, methods, or subroutines which are carried out in the example method. Furthermore, the order of blocks is illustrative only and additional blocks can be added or fewer blocks may be utilized without departing from the scope of this disclosure.

At block 401, the electronic device 100 is in the normal mode.

At block 402, detecting whether the first battery 12 is latched in the main body 11. When the first battery 12 is latched in the main body 11, block 403 is implemented. When the first battery 12 is not latched in the main body 11, block 404 is implemented.

In this exemplary embodiment, the first battery 12 is latched in the main body 11 through the latching structure 231 positioned at a bottom portion of the operating unit 23. When the operating unit 23 moves the magnetic unit 21 closer to the hall sensor 20, the latching structure 231 can effectively attach the first battery 12 to the main body 11 or detach the first battery 12 from the main body 11. When the operating unit 23 moves the magnetic unit 21 away from the hall sensor 20, the latching structure 231 can also effectively attach the first battery 12 to the main body 11 or detach the first battery 12 from the main body 11. Then, whether the first battery 12 is latched to the main body 11 can be detected through detecting a movement of the operating unit 23 or detecting whether the magnetic unit 21 moves closer to or moves away from the hall sensor 20.

At block 403, determining whether a hot-swap function to the first battery 12 is triggered when the first battery 12 is detected to be latched in the main body 11. For example, the hot-swap function to the first battery 12 can be selected through a user interface of the electronic device 100, for example, the display unit 19. When the hot-swap function to the first battery 12 is triggered, block 404 is implemented. When the hot-swap function to the first battery 12 is not triggered, block 401 is implemented, that is, the electronic device 100 is still in the normal mode.

At block 404, detecting whether an amount of remaining power of the second battery 13 is less than a first predetermined value when the first battery 12 is not latched to the main body 11 or when the hot-swap function to the first battery 12 is triggered. When the amount of remaining power of the second battery 13 is less than the first predetermined value, block 405 is implemented. When the amount of remaining power of the second battery 13 is not less than the first predetermined value, block 406 is implemented.

At block 405, prompting the user that the second battery 13 is in a low power mode and the hot-swap function to the first battery 12 is disabled. When the hot-swap function to the first battery 12 is disabled, the hot-swap function to the first battery 12 is not allowed to be operated. Generally, when the second battery 13 is in the low power mode, the amount of remaining power of the second battery 13 cannot maintain a normal working level of the electronic device 100, which can lead to data loss or other problems. Thus, when the hot-swap function to the first battery 12 is disabled because the amount of remaining power of the second battery 13 is less than the first predetermined value, the hot-swap function to the first battery 12 is not allowed to be operated and the first battery 12 will provide power to the electronic device 100, then data loss or other problems can be effectively prevented. In this exemplary embodiment, the power level that is considered to be in the low power mode is determined by the manufacturer.

At block 406, disabling a charging path of the electronic device 100. For example, controlling a charging port of the electronic device 100 to be disabled, thus preventing outside power source from charging the first battery 12 or the second battery 13 through the charging path.

At block 407, disabling a predefined function of the electronic device 100 which is capable of turning on or waking up the electronic device 100. For example, the predefined function may be a Bluetooth or WIFI function of the electronic device 100. The predefined function can be turned off to prevent the electronic device 100 from being woken up due to some unavoidable conditions in the hot-swap process, thus effectively improving stability of the electronic device 100.

At block 408, prompting the user that the hot-swap function to the first battery 12 can be operated. For example, the electronic device 100 can further include at least one first indicating unit. Then when the at least one first indicating unit is turned on or flashing, the user is prompted that the hot-swap function to the first battery 12 can be operated.

In other exemplary embodiments, the user can be prompted that the hot-swap function to the first battery 12 can be operated through other ways, for example, the user can be prompted that the hot-swap function to the first battery 12 can be operated through text message or voice message.

At block 409, the electronic device 100 enters the sleep mode, which facilitates an operation of the hot-swap function to the first battery 12.

At block 410, determining whether the battery switching unit 14 receives a removing signal for removing the first battery 12. When the battery switching unit 14 receives the removing signal, block 411 is implemented. When the battery switching unit 14 does not receive the removing signal, block 409 is implemented. That is, the electronic device 100 is still in the sleep mode.

In this exemplary embodiment, a length of the ID terminal 123 is less than a length of the power terminal 121. Then when the first battery 12 is inserted in the main body 11, the power terminal 121 and the ID terminal 123 are both electrically connected to a connector that is positioned at an interior of the main body 11. Then the first battery 12 is electrically connected to the PMIC unit 15 for providing power to the PMIC unit 15. When the first battery 12 is removed from the main body 11, due to the length of the ID terminal 123 being less than that of the power terminal 121, the ID terminal 123 is first disconnected from the connector of the main body 11 and the power terminal 121 remains in connection with the connector. Then the first battery 12 temporarily provides power to the PMIC unit 15 through the power terminal 121 until the first battery 12 is fully removed from the main body 11. Full removal means that the power terminal 121 and the ID terminal 123 are both disconnected from the connector.

Additionally, due to the battery switching unit 14 is electrically connected to the first battery 12 and the second battery 13. When the ID terminal 123 is electrically connected to or disconnected from the connector positioned in the main body 11, the battery switching unit 14 can receive a correspond signal, thus determining whether the first battery 12 is inserted to the main body 11 or is removed from the main body 11 through the received signal.

For example, when the ID terminal 123 is disconnected from the connector that is positioned in the main body 11, the battery switching unit 14 receives the removing signal, thus determining that the first battery 12 is removed from the main body 11. When the ID terminal 123 is electrically connected to the connector that is positioned in the main body 11, the battery switching unit 14 receives an inserting signal, thus determining that the first battery 12 is plugged to the main body 11.

At block 411, the battery switching unit 14 switches the PMIC unit 15 to the second battery 13. That is, a power source of the electronic device 100 is switched to the second battery 13 and the electronic device 100 is powered by the second battery 13, which can facilitate an operation of the hot-swap function to the first battery 12.

At block 412, determining whether the battery switching unit 14 receives the inserting signal. When the battery switching unit 14 receives the inserting signal, block 413 is implemented. When the battery switching unit 14 does not receive the inserting signal, block 412 is still implemented.

At block 413, the battery switching unit 14 switches the PMIC unit 15 to the first battery 12, that is, a power source of the electronic device 100 is switched to the first battery 12 and the electronic device 100 is powered by the first battery 12.

At block 414, detecting whether the first battery 12 is latched in the main body 11. When the first battery 12 is latched in the main body 11, block 415 is implemented. When the first battery 12 is not latched in the main body 11, block 409 is implemented, that is, the electronic device 100 is still in the sleep mode. Then, when the electronic device 100 is in the sleep mode, even when the first battery 12 is already inserted in the electronic device 100, the first battery 12 does not provide power to the electronic device 100.

At block 415, determining whether an amount of remaining power of the first battery 12 is less than a second predetermined value when the first battery 12 is latched to the main body 11. When the amount of remaining power of the first battery 12 is less than the second predetermined value, block 416 is implemented. When the amount of remaining power of the first battery 12 is greater than or equal to the second predetermined value, block 417 is implemented.

At block 416, prompting the user that the first battery 12 is in a low power mode. For example, the electronic device 100 can further include at least one second indicating unit. Then when the at least one second indicating unit is turned on or flashing, the user is prompted that the first battery 12 is in the low power mode and block 408 is implemented.

In other exemplary embodiment, the user can be prompted that the first battery 12 is in the low power mode through other ways, for example, the user can be prompted that the first battery 12 is in the low power mode through text message or voice message.

At block 417, prompting the user that the hot-swap function to the first battery 12 is no longer operative. For example, a signal is provided so that the at least one first indicating unit is completely turned off or stops flashing.

At block 418, updating parameters of the first battery 12, for example, updating a voltage of the first battery 12 and/or a capacity of the first battery 12, thus facilitating power management of the electronic device 100.

At block 419, enabling the predefined function of the electronic device 100 which is disabled at block 407. Then, the electronic device 100 can enable the predefined function, for example, open the Bluetooth and WIFI function.

At block 420, the electronic device 100 is switched to the normal mode, then the electronic device 100 is powered by the first battery 12.

In other exemplary embodiments, the order of blocks can be changed and some blocks can be omitted or be combined according to different needs. For example, in at least one exemplary embodiment, when the electronic device 100 does not include the latching structure, blocks 402 and 414 can both be omitted. That is, block 403 is directly implemented after block 401 is implemented. At the same time, block 415 is directly implemented after block 413 is implemented.

In other exemplary embodiments, block 403 can be omitted. If block 403 is omitted, block 402 makes direct feedbacks to block 401 when the first battery 12 is determined to be latched.

In other exemplary embodiments, the order of blocks 406-408 can be changed according to different needs. For example, blocks 407, 406, and 408 can be implemented in the sequence described. Furthermore, one of the blocks 406-408, two of the blocks 406-408, or all blocks 406-408 can be omitted according to different needs.

In other exemplary embodiments, block 417 can be omitted. For example, when the method does not include block 408, block 417 can be omitted.

In other exemplary embodiments, block 419 can be omitted. For example, when the method does not include block 407, block 419 can be omitted.

In other exemplary embodiments, when block 408 is omitted, block 409 can be directly implemented after block 416 is implemented. Furthermore, block 416 can be omitted. Then, at block 415, when the amount of remaining power of the first battery 12 is determined to be less than the second predetermined value, block 409 is directly implemented.

The exemplary embodiments shown and described above are only examples. Many details are often found in the art such as the other features of the antenna module and the wireless communication device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the exemplary embodiments described above may be modified within the scope of the claims.

What is claimed is:

1. A battery switching method applicable to an electronic device, the electronic device comprising a first battery and a second battery, the first battery including an ID terminal, the method comprising:

(a) switching the electronic device to a sleep mode from a normal mode;

(b) switching a power supply of the electronic device to the second battery according to a removing signal triggered by removing the first battery, wherein the removing signal is generated upon the ID terminal of the first battery being disconnected from the electronic device during the removing of the first battery;

(c) switching the power supply of the electronic device to the first battery according to an inserting signal triggered by inserting the first battery, wherein the inserting signal is generated upon the ID terminal of the first battery being electrically connected to the electronic device during the inserting of the first battery;

(d) updating parameters of the first battery, the parameters comprising at least one of a voltage and a capacity of the first battery; and (e) switching the electronic device to the normal mode from the sleep mode.

2. The battery switching method of claim 1, further comprising:
   detecting whether the first battery is latched; and
   implementing step (a) when the first battery is not latched.

3. The battery switching method of claim 1, further comprising:
   determining whether a hot-swap function to the first battery is triggered; and
   implementing step (a) when the hot-swap function to the first battery is triggered.

4. The battery switching method of claim 3, wherein at step (a), before the electronic device enters the sleep mode, the method further comprises:
   detecting whether an amount of remaining power of the second battery is less than a first predetermined value; and
   prompting the second battery is in a low power mode and the hot-swap function to the first battery is disabled when the amount of remaining power of the second battery is less than the first predetermined value.

5. The battery switching method of claim 1, wherein at step (a), before the electronic device enters the sleep mode, the method further comprises disabling a charging path of the electronic device.

6. The battery switching method of claim 1, wherein at step (a), before the electronic device enters the sleep mode, the method further comprises disabling a predefined function of the electronic device which is capable of turning on or waking up the electronic device.

7. The battery switching method of claim 6, wherein after step (c), the method further comprises enabling the predefined function of the electronic device.

8. The battery switching method of claim 1, wherein at step (a), before the electronic device enters the sleep mode, the method further comprises prompting a hot-swap function to the first battery to be operative.

9. The battery switching method of claim 8, wherein after step (c), the method further comprises prompting the hot-swap function to the first battery is no longer operative.

10. The battery switching method of claim 1, wherein between steps (c) and (d), the method further comprises:
    detecting whether the first battery is latched;
    detecting whether an amount of remaining power of the first battery is less than a second predetermined value when the first battery is detected to be latched; and
    prompting the first battery is in a low power mode when the amount of remaining power of the first battery is less than the second predetermined value.

11. The battery switching method of claim 1, wherein switching the power supply of the electronic device to the second battery is carried out during a time lag between the disconnection of the ID terminal from the electronic device and the disconnection of a power terminal of the first battery from the electronic device.

* * * * *